United States Patent
Gaoiran

(10) Patent No.: US 12,085,606 B2
(45) Date of Patent: Sep. 10, 2024

(54) SCALABLE TESTER FOR TESTING MULTIPLE DEVICES UNDER TEST

(71) Applicant: Albert Gaoiran, San Jose, CA (US)

(72) Inventor: Albert Gaoiran, San Jose, CA (US)

( * ) Notice: Subject to any disclaimer, the term of this patent is extended or adjusted under 35 U.S.C. 154(b) by 0 days.

(21) Appl. No.: 17/732,910

(22) Filed: Apr. 29, 2022

(65) Prior Publication Data
US 2022/0252662 A1 Aug. 11, 2022

Related U.S. Application Data

(63) Continuation of application No. 16/531,097, filed on Aug. 4, 2019, now Pat. No. 11,320,480, which is a continuation of application No. 15/411,689, filed on Jan. 20, 2017, now abandoned.

(60) Provisional application No. 62/281,733, filed on Jan. 22, 2016.

(51) Int. Cl.
*G01R 31/28* (2006.01)
*G01R 1/04* (2006.01)

(52) U.S. Cl.
CPC ....... *G01R 31/2849* (2013.01); *G01R 1/0408* (2013.01)

(58) Field of Classification Search
CPC .......... G01R 31/2849; G01R 31/31907; G01R 1/0408
See application file for complete search history.

(56) References Cited

U.S. PATENT DOCUMENTS

| | | | | |
|---|---|---|---|---|
| 9,164,859 | B2* | 10/2015 | Rivera Trevino | G06F 11/263 |
| 11,320,480 | B1* | 5/2022 | Gaoiran | G01R 31/2849 |
| 2003/0042595 | A1* | 3/2003 | Canella | H01L 23/49811 |
| | | | | 257/737 |
| 2006/0020867 | A1* | 1/2006 | Evans | G01R 31/31903 |
| | | | | 714/742 |
| 2014/0253099 | A1* | 9/2014 | Han | G01R 19/00 |
| | | | | 324/126 |
| 2015/0145548 | A1* | 5/2015 | Duncan | G01R 3/00 |
| | | | | 29/592.1 |
| 2015/0377924 | A1* | 12/2015 | Hwang | G01R 31/2601 |
| | | | | 324/756.02 |
| 2016/0091531 | A1* | 3/2016 | Park | G01R 31/2889 |
| | | | | 324/756.07 |
| 2017/0212164 | A1* | 7/2017 | Caradonna | G01R 31/31905 |

* cited by examiner

*Primary Examiner* — Dominic E Hawkins
(74) *Attorney, Agent, or Firm* — Owens Law Firm, PC

(57) ABSTRACT

Various embodiments of the invention provide a system and a method for testing one or more devices under test (DUTs) and for checking one or more test setups. Each of the one or more test setups includes a test board having several sockets for receipt of a DUT. A custom hardware interface is used to electrically connect the test board, such as a burn-in board with a test system configuration having multiple modules that can be configured using a computer device and related software to provide customized testing of the DUTs. The system is scalable to accommodate any DUT having any number of channels and to provide customized testing. Results of the testing are sent to the computing device.

12 Claims, 10 Drawing Sheets

PROGRAMMABLE RESET MODULE (PRM) (NEW) - COMBINED PM + SWITCH

PRM

◄ TX0    RESET ►
► RX0

POWER MODULE (305)

AGC4023_LVPM

◄ TX0    DACOUT ►
► RX0

AGC4023_HVPM

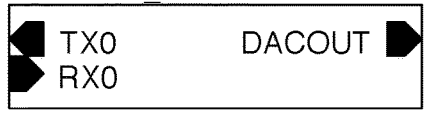
◄ TX0    DACOUT ►
► RX0

THERMAL MANAGEMENT MODULE

TMM

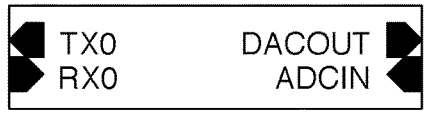
◄ TX0    DACOUT ►
► RX0    ADCIN ◄

PROGRAMMABLE LOAD MODULE (PLM) (NEW) DRIVER + RESISTORS + ADM CONTINUITY TESTER MODULE

PLM

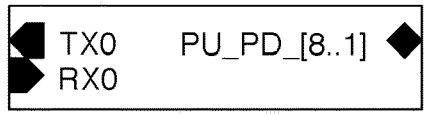
◄ TX0    PU_PD_[8..1] ◆
► RX0

BUS SWITCH MODULE (BSM) NEW, REVISED MUX

PBM

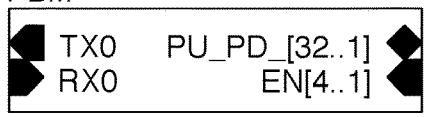
◄ TX0    PU_PD_[32..1] ◄
► RX0    EN[4..1] ◄

LEVEL SHIFT MODULE (LSM)

LSM

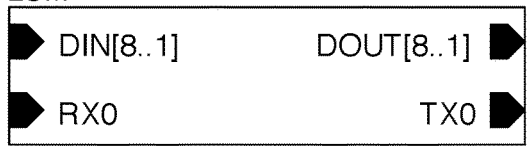
► DIN[8..1]    DOUT[8..1] ►
► RX0    TX0 ►

POWER MANAGEMENT MODULE (320)

ADM_1

◄ TX0    AIN[8..1] ◄
► RX0

AGC4023_LVPM_1

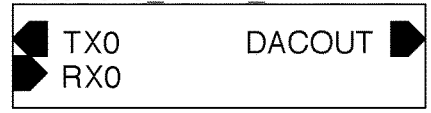
◄ TX0    DACOUT ►
► RX0

AGC4023_HVPM_1

◄ TX0    DACOUT ►
► RX0

PROGRAMMABLE RESET MODULE

PRM

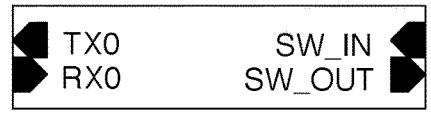
◄ TX0    SW_IN ◄
► RX0    SW_OUT ►

DIGITAL CAPTURE MODULE (DCM) 315 (REVISED) NEW, CAPTURES 1 - 8 PINS, 1 CYCLE OR MULTI-CYCLE.

DCM_1

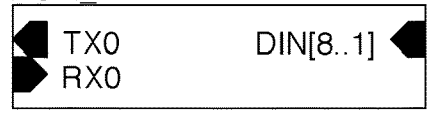
◄ TX0    DIN[8..1] ◄
► RX0

ANALOG TO DIGITAL MODULE (ADM) 310

ADM

◄ TX0    AIN[8..1] ◄
► RX0

ALL TESTER MODULES ARE PC PROGRAMMABLE HAVING ITS OWN HW_ID. CAN BE PROGRAMMED IN SERIAL MODE OR IN PARALLEL MODE.

BUILDING BLOCKS THAT CAN BE CONFIGURED TO MEET ANY CUSTOMERS TESTING REQUIREMENTS

FIG. 7A

MUX 330
MUX

PATTERN GENERATOR MODULES (335)
AGC5006

AGC4023_MEM

AGC_HS_DRIVER

TESTER CONFIGURATION EXAMPLES

CRITERIA48_TIB

CRITERIA_CH[48..1]
PS[4..1]
AGC4023AC_[48..1]
AGC_PGMLD[48..1]
AGC_HS_DRV[48..25]
AGC_HS_DRV[24..1]

CRITERIA_48_BIB

CRITERIA96_TIB

CRITERIA_CH[96..1]
PS[4..1]
AGC4023AC_[96..1]
AGC_PGMLD[96..1]
AGC_HS_DRV[96..1]

CRITERIA_96_BIB

INCAL160_TIB

INCAL_CH[160..1]
PS[4..1]
AGC_PGM_LD_[168..1]
AGC_PGMLD_[168..1]
AGC_HS_DRV[168..1]

INCAL_160

CUSTOM_TIB

INCAL_CH[160..1]
PS[4..1]
AGC_PGM_LD_[168..1]
AGC_PGMLD_[168..1]
AGC_HS_DRV[168..1]

CUSTOM_BIB

BASIC TEST PORT

```
         J2
   1  ┌─────────────┐  26
──────┤ PWR1   PWR3 ├──────
   2  │             │  27
──────┤ PWR2   PWR4 ├──────
   3  │             │  28
──────┤ AIN1   AIN21├──────
   4  │             │  29
──────┤ AIN2   AIN22├──────
   5  │             │  30
──────┤ AIN3   AIN23├──────
   6  │             │  31
──────┤ AIN4   AIN24├──────
   7  │             │  32
──────┤ AIN5   AIN25├──────
   8  │             │  33
──────┤ AIN6   AIN26├──────
   9  │             │  34
──────┤ AIN7   AIN27├──────
  10  │             │  35
──────┤ AIN8   AIN28├──────
  11  │             │  36
──────┤ AIN9   AIN29├──────
  12  │             │  37
──────┤ AIN10  AIN30├──────
  13  │             │  38
──────┤ AIN11  AIN31├──────
  14  │             │  39
──────┤ AIN12  AIN32├──────
  15  │             │  40
──────┤ AIN13   SIG1├──────
  16  │             │  41
──────┤ AIN14   SIG2├──────
  17  │             │  42
──────┤ AIN15   SIG3├──────
  18  │             │  43
──────┤ AIN16   SIG4├──────
  19  │             │  44
──────┤ AIN17   SIG5├──────
  20  │             │  45
──────┤ AIN18   SIG6├──────
  21  │             │  46
──────┤ AIN19   SIG7├──────
  22  │             │  47
──────┤ AIN20   SIG8├──────
  23  │             │  48
──────┤ INT OUTCLK  ├──────
  24  │             │  49
──────┤ GND     GND ├──────
  25  │             │  50
──────┤ GND     GND ├──────
      └─────────────┘
```

FIG. 7D

SCALABLE TESTER FOR TESTING MULTIPLE DEVICES UNDER TEST

CROSS-REFERENCE TO RELATED APPLICATIONS

This application is a continuation of U.S. patent application Ser. No. 16/531,097 filed Aug. 4, 2019, which is a continuation of U.S. patent application Ser. No. 15/411,689 filed Jan. 20, 2017, which claims the benefit of provisional Application No. 62/281,733, filed Jan. 22, 2016. The entireties of the foregoing applications are incorporated by reference herein in their entireties.

BACKGROUND OF THE INVENTION

Field of the Invention

The invention in its various embodiments relates generally to testing devices under test or DUTs. In particular, the invention in its various embodiments relates to a system and a method for testing DUTs that is customizable for any DUT and that is scalable to the number of pins on the DUT, particularly for DUT testing using a burn-in board.

Description of Related Art

Devices, for example, integrated circuit devices, need to be tested before marketing. The devices, while undergoing testing, are referred to as "devices under test" (DUTs). The DUTs are tested by connecting the DUTs with a test board. Various testing boards can be utilized for testing the DUT. The testing board may include several electrical connectors for connecting the testing board with the DUT. However, such testing boards are complex and bulky. Test boards are also limited to testing a set number of DUTs based on the number of available sockets, as well as a given number of channels per DUT based upon the available channels on the test board, the fixed number of resources available to use such channels, and the software available to control such resources. Therefore, in some situations, a DUT must be tested using multiple passes to accommodate all of the DUTs channels. The testing boards may also require a temperature control system for testing the DUT under controlled temperatures.

For example, a burn-in board may be used to test a DUT and is connected to the DUT while testing is performed. The burn-in board includes a limited number of sockets in which the DUTs are placed for testing inside a test chamber, for example, an oven. The burn-in board is used to apply power to the DUT, supply stimulus signals, measure temperature of the DUT, regulate temperature of the oven, measure test points, and evaluate resulting outputs from the DUT. Further, it is often desirable to monitor test parameters, for example, supply voltage and current. However, after testing with the burn-in board, the DUTs typically must be removed and tested for functionality using a second tester.

In addition, a test setup (including the DUT and any associated burn-in board hardware) needs to be checked to ensure a valid test setup. There are various techniques available for checking test setups. One such technique includes placing the DUT into a socket of the burn-in board. The test setup is then checked using a tester, for example, a probe tester. However, the tester requires an external fixture identical in dimension with the DUT for testing connectivity of the socket to the DUT. This limits the use of the tester to DUTs of one particular dimension and hence makes the tester expensive. Further, the tester requires manual intervention. Another technique for checking the test setups includes using a Field Programmable Gate Array (FPGA) tester. However, the FPGA tester makes use of Joint Test Access Group (JTAG) ports during testing. Hence, there is a necessity for the DUTs to have built-in JTAG blocks. However, existing systems for checking test setups also utilize and are limited by a fixed number of resources.

Increasing complexity of integrated circuits and semiconductor devices has made their testing more challenging with existing testers. For example, testing complex integrated circuits requires high current and low voltage. Hence, power supplies that provide the high current and the low voltage incur additional costs for testing, resulting in testing costs being a higher percentage of the total manufacture cost of the integrated circuit. For example, due to increasing complexity of semiconductor devices, manufacturers are forced to buy new equipment having the required test resources, which requires training to implement any reliability tests, increasing time-to-market for the device.

In light of the foregoing discussion, there is a need for a system and a method for testing DUTs, particularly using burn-in boards, that can be customized or scaled to the number of channels on the DUT to avoid multiple pass testing and testing with multiple different testers. In addition, there is a need for a system and a method for checking test setups that do not require an external fixture identical in dimension with the DUT for testing the connectivity of the socket to the DUT. Further, a tester for checking test setups without the use of JTAG ports, and for checking test setups under controlled temperature conditions and with minimal human intervention, is desired. Moreover, a tester for checking large number of test setups with the lowest power supply requirement is desired. Hence, a generic testing system that can be repeatedly used without buying new equipment or changing software is desired.

BRIEF SUMMARY OF THE INVENTION

Generally, various embodiments of the invention provide a system and a method for testing a device under test (DUT) and for checking one or more test setups. Each of the one or more test setups includes a test board having one or more sockets. Each socket is adapted to receive a DUT. Each DUT is connected to the corresponding socket through socket wiring. The system also has a test system configuration containing one or more modules having the necessary electronics to provide a given function for use in testing the DUT. The test system configuration is programmed to test each DUT or to test the one or more test setups. Results of the testing are sent to a computing device for analysis and use.

In one embodiment, the invention provides a system for testing at least one electronic device, comprising a test board having at least one socket for receiving a corresponding at least one electronic device to be tested; a hardware interface electrically connected to the at least one socket of the test board; a test system configuration comprising at least one module for testing the corresponding one electronic device, electrically connected to the hardware interface; and a computing device electrically connected to said test system configuration.

In another embodiment, the invention provides a method for testing at least one electronic device, comprising: connecting at least one electronic device to at least one socket on at least one burn-in board; connecting the at least one burn-in board to at least one test system configuration;

connecting the at least one test system configuration to a computing device; and testing the at least one electronic device.

As noted, the test system configuration includes various modules that are used as building blocks to design testing for a given DUT. Specifically, the modules within the test system configuration include the electronics to provide, among other things, the specific tests designed for the DUT and to receive output data from the DUT to evaluate the DUT performance and functionality. These modules can be configured using software to permit the design and implementation of a customized test or series of tests on the DUT, including a series of tests on a DUT on a burn-in board. Each module can be customized and used repeatedly, and additional modules can be added, within each test system configuration to provide the tests desired for a given DUT, and the system can be configured to receive data or signals from the output channels of the DUT without the need for subsequent testing by a second tester, particularly when using a burn-in board. Accordingly, the system is scalable in that it can be used to test any DUT having any number of channels or pins without the need to use additional modules outside of the test system configuration or additional testers.

BRIEF DESCRIPTION OF THE SEVERAL VIEWS OF THE DRAWINGS

In the accompanying figures, similar reference numerals may refer to identical or functionally similar elements. These reference numerals are used in the detailed description to illustrate various embodiments and to explain various aspects and advantages of the present disclosure.

FIG. 7A-7D is a schematic according to one embodiment of the present invention.

DETAILED DESCRIPTION OF THE EMBODIMENTS

Figure 1:
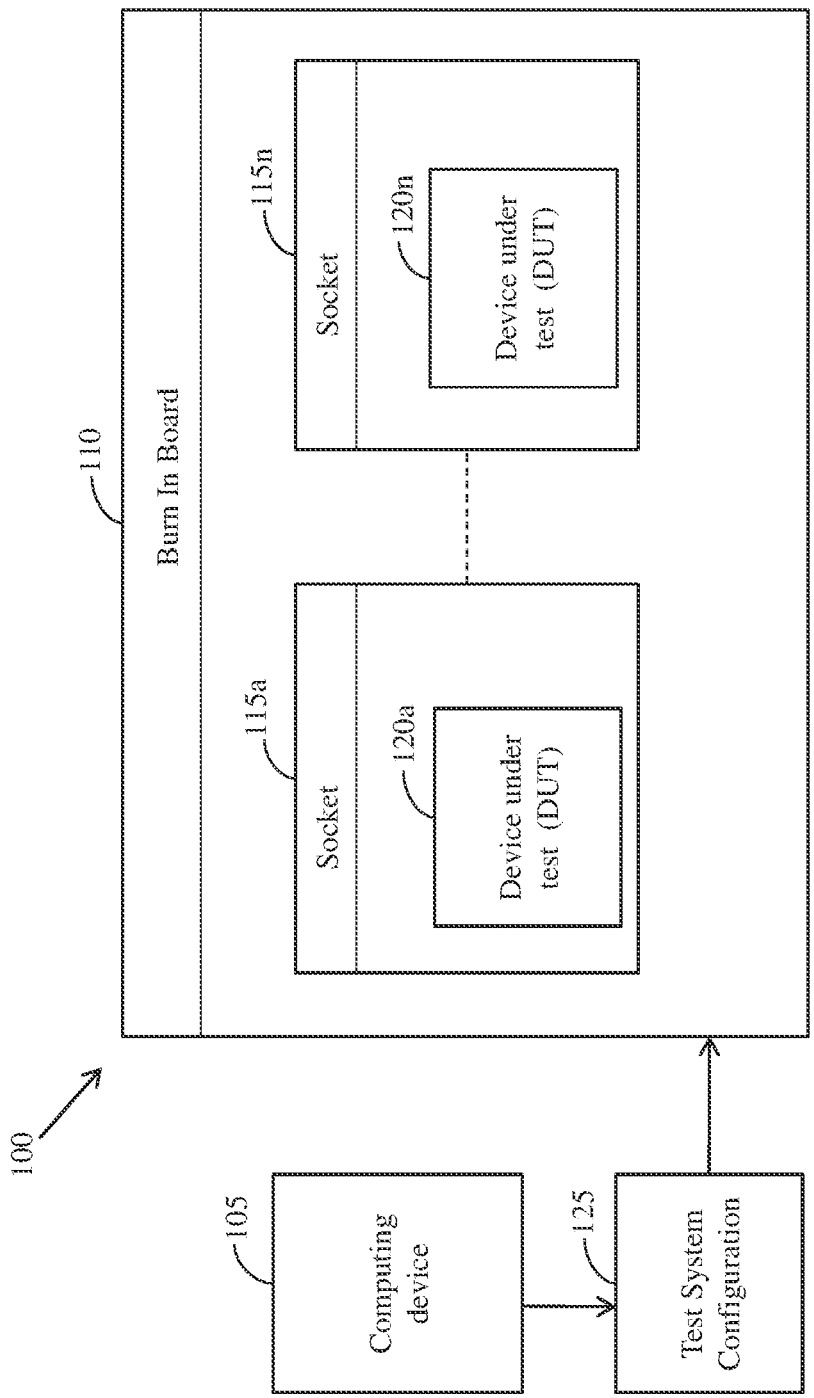
FIG. 1 is a block diagram of an environment in accordance with which various embodiments can be implemented.

The present invention is more fully described below with reference to the accompanying Figures. While the invention will be described in conjunction with particular embodiments, it should be understood that the invention includes alternatives, modifications, and equivalents. Accordingly, the following description is exemplary in that several embodiments are described (e.g., by use of the terms "preferably," "for example," or "in one embodiment"), but this description should not be viewed as limiting or as setting forth the only embodiments of the invention, as the invention encompasses other embodiments not specifically recited in this description. Further, the use of the terms "invention," "present invention," "embodiment," and similar terms throughout this description are used broadly and are not intended to mean that the invention requires, or is limited to, any particular aspect being described or that such description is the only manner in which the invention may be made or used.

Generally, various embodiments of the invention provide a system and a method for testing a device under test (DUT) and for checking one or more test setups. Each of the one or more test setups includes a test board having one or more sockets. Each socket is adapted to receive a DUT. Each DUT is connected to the corresponding socket through socket wiring. The system also has a test system configuration containing one or more modules having the necessary electronics to provide a given function for use in testing the DUT. The test system configuration is programmed to test each DUT or to test the one or more test setups. Results of the testing are sent to a computing device for analysis and use.

The various embodiments of the system generally include a test board, such as a burn-in board, that is customized for electrically connecting one or more DUT through one or more customized sockets to allow connection to each channel or pin of the DUT. In addition, the system includes a customized hardware interface designed to electrically connect on one side to the test board, such as a burn-in board, to permit communication with each channel of the DUT and to electrically connect on the other side to a test system configuration that includes the necessary electronics to both drive the DUT and to receive data from the DUT for evaluation. The test system configuration includes various modules that are used as building blocks to design testing for a given DUT. Specifically, the modules within the test system configuration include the electronics to provide, among other things, the specific tests designed for the DUT and to receive output data from the DUT to evaluate the DUT performance and functionality. These modules can be configured using software to permit the design and implementation of a customized test or series of tests on the DUT, including a series of tests on a DUT on a burn-in board. Each module can be customized and used repeatedly, and additional modules can be added, within each test system configuration to provide the tests desired for a given DUT, and the system can be configured to receive data or signals from the output channels of the DUT without the need for subsequent testing by a second tester, particularly when using a burn-in board. Accordingly, the system is scalable in that it can be used to test any DUT having any number of channels without the need to use additional modules outside of the test system configuration or additional testers. For example, the test system configuration can drive the DUT to perform a given set of tests, and data from the DUT, which is passed through its output channels from such tests, can be collected by the test system configuration and stored on a computing device for subsequent evaluation.

It should be appreciated that a given test setup can be easily tested an verified. For example, in one embodiment, a driver that sends a given stimulus based on pattern files or test vectors for a given DUT can be connected directly to a capture module to verify the stimulus by comparing the captured data with the original pattern file. This procedure can be followed to verify any test setup.

FIG. 1 is a block diagram of an environment in accordance with which various embodiments can be implemented. The environment 100 includes a computing device 105, a burn-in board 110, a test system configuration 125, one or more sockets including a socket 115*a* through a socket 115n, and one or more DUTs including a DUT 120a through a DUT 120n. The computing device 105 communicates with the burn-in board 110. The burn-in board 110 includes the socket 115a through the socket 115n. The socket 115a through the socket 115n are adapted to receive the DUT 120a through the DUT 120n, respectively.

Examples of the environment 100 include, but are not limited to, a burn-in test system, a DUTs system, a highly accelerated stress test (HAST) systems, and other test systems. Examples of the computing device 105 include, but are not limited to, a personal computer (PC), microprocessor, laptop computer, and data processing device. The computing device 105 can include a storage device for storing data. In an embodiment of the invention, the computing device 105 can be connected to the storage device for storing the data.

Examples of the DUTs include, but are not limited to, integrated circuits and other semiconductor devices. Each of the DUTs may be mounted on or placed into the corresponding socket. For example, the DUT 120a can be mounted on the socket 115a.

Each DUT connected to the corresponding socket may constitute a test setup. The burn-in board 110 is in communication with the test system configuration 125. The test system configuration 125 comprises at least one testing module, each of which can be controlled individually or in parallel operation. Each of the at least one testing modules can further be programmed with at least one set of software or firmware instructions to direct the implementation or performance of a given test on a given DUT. The test system configuration 125 is configured to supply power to the test setup. The test system configuration 125 is also configured to test the DUTs under various conditions as specified by a user. Before testing of one or more DUTs, the test system configuration 125 can be verified to ensure proper electrical connection between the one or more DUTs to be tested and the various sockets to which they are connected. The test system configuration 125 is also utilized to test the DUTs placed in various types of burn-in boards. The test system configuration 125 can be configured to perform testing of the DUTs placed in various test chambers. A system including the test system configuration 125 corresponding to each test setup is explained in detail in conjunction with FIG. 2.

Figure 2:
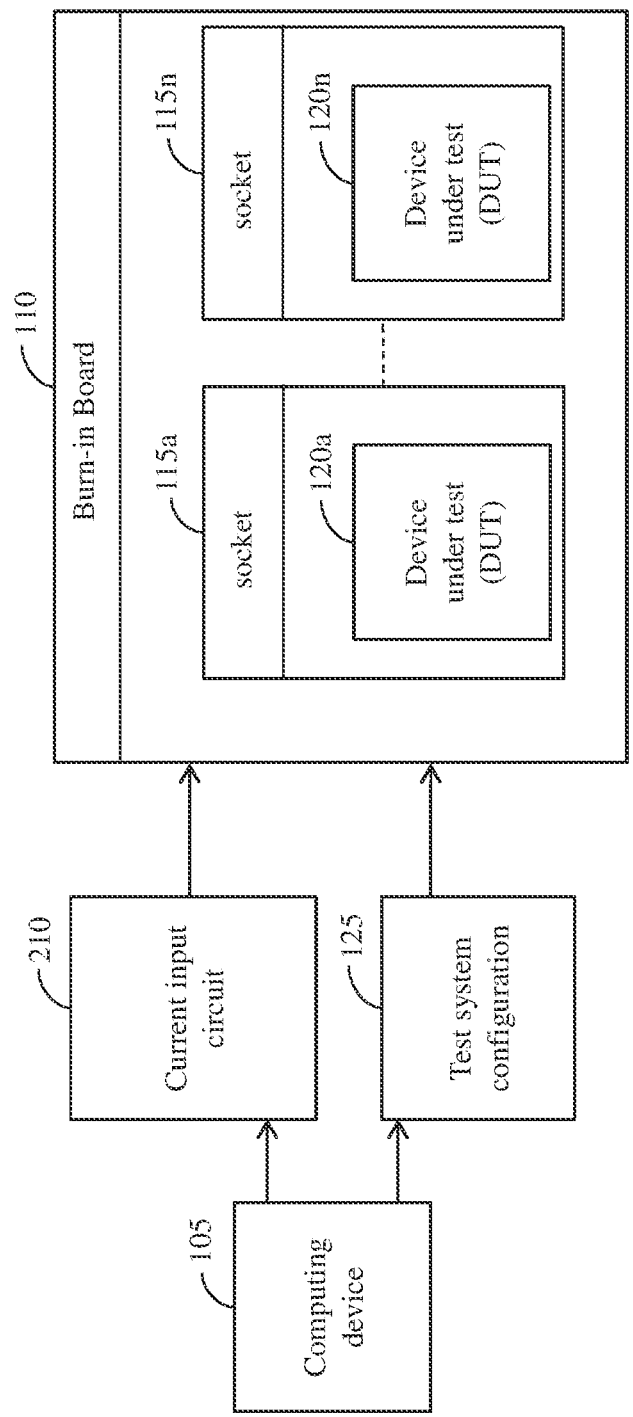
FIG. 2 is a schematic representation of a system in accordance with one embodiment.

FIG. 2 is a schematic representation of a system in accordance with one embodiment. FIG. 2 includes a burn-in board, for example, the burn-in board 110, a test system configuration, for example, test system configuration 125, a current input circuit 210, and a computing device, for example, the computing device 105. The burn-in board 110 further includes one or more sockets, for example, the socket 115a through the socket 115n. Each of the sockets include a DUT, for example, the DUT 120a through the DUT 120n.

The burn-in board 110 is utilized for testing the DUTs. The burn-in board 110 may include a plurality of electrical contacts for testing electrical communication between leads of the DUT and the burn-in board 110. Further, the burn-in board 110 may include a user interface. The user interface may be utilized to communicate with the computing device 105. The burn in board 105 can be configured to meet customer requirements such as flexibility, number of DUTs, testing time, and obtaining maximum throughput with low cost.

The DUTs are placed within a socket when subjected to testing. In one example, the DUT 120a is placed within the socket 115a. In another example, the DUT 120n is placed within the socket 115n. Each socket may be configured to accept a single DUT. The socket 115a may include a cavity for placing the DUT 120a. Further, the socket 115a includes a plurality of pins for testing electrical connectivity between the socket 115a and the DUT 120a. The socket 115a is in communication with the test system configuration 125.

The test system configuration consists of test modules, each of which is a physical module comprising at least one set of programmed software or firmware instructions that direct the implementation or performance of a given test on a given DUT. At least one test module in the test system configuration 125 is configured to provide power for testing the DUT 120a through the DUT 120n. As an illustrative, non-limiting example, one module on a single test system configuration 125 may be utilized for supplying power to large number of DUTs. Additionally, one or more test modules in the test system configuration 125 supplies multiple ranges of voltages for testing the DUT 120a. The multiple ranges of voltages are defined based on customer requirements. Furthermore, the test system configuration 125 is programmed to communicate with one or more computing devices, for example, a computer, laptop, and the like. The computing device 105 may include software for establishing communication between the test system configuration 125 and the DUT 120a through DUT 120n. One or more test modules in the test system configuration 125 may also be used to measure voltage values of the DUTs. The voltage values are measured to determine the working of the DUTs under specified voltage range. Further, the voltage values are measured to determine various other test parameters, for example, current, embedded thermal diode, embedded thermistors, oven temperature, and ground bounce. The test system configuration 125 is also utilized for testing the DUTs embedded in various types of burn-in boards and various types of testing chambers. These various testing modules in the test system configuration 125 are described in more detail below in conjunction with FIG. 3.

Each DUT may be connected to the test system configuration 125 independent of any fixture that may be in contact with the DUT in the respective socket. Examples of fixtures include, but are not limited to, probes, clips, ports, and the like. Each DUT is connected to the corresponding sockets through socket wiring. For example, the DUT 120a is connected to the socket 115a through socket wiring.

One or more testing modules in the test system configuration 125 may include one or more channels. The channels can be configurable channels and are utilized for establishing an interface with the DUT. The channels may be utilized for communication with the computing device 105. Further, the channels included in the one or more testing modules in the test system configuration 125 may be programmable. The programmable addresses can be used for communication between the test system configuration 125 and the computing device 105. In one example, if the computing device 105 wishes to communicate with the test system configuration 125, then the computing device 105 may send a request including a programmable address to one or more testing modules in the test system configuration 125. Further, the computing device 105 is utilized to store results of testing.

The system further includes a power load module (PLM) 210. The PLM 210 or current input circuit can include a junction field effect transistor (JFET) with gate and source channel shorted. The PLM 210 also includes a bipolar junction transistor (BJT). The PLM 210 is utilized for providing constant current for testing connectivity of the one or more pins of the DUT 120a through DUT 120n. The supply of constant current by the PLM 210 may be controlled by a power module present in the test system configuration 125. The power module in this embodiment is one of the many possible testing modules that can be present in the test system configuration 125. The test system configuration 125 and various testing modules are explained in detail in conjunction with FIG. 3.

Figure 3:
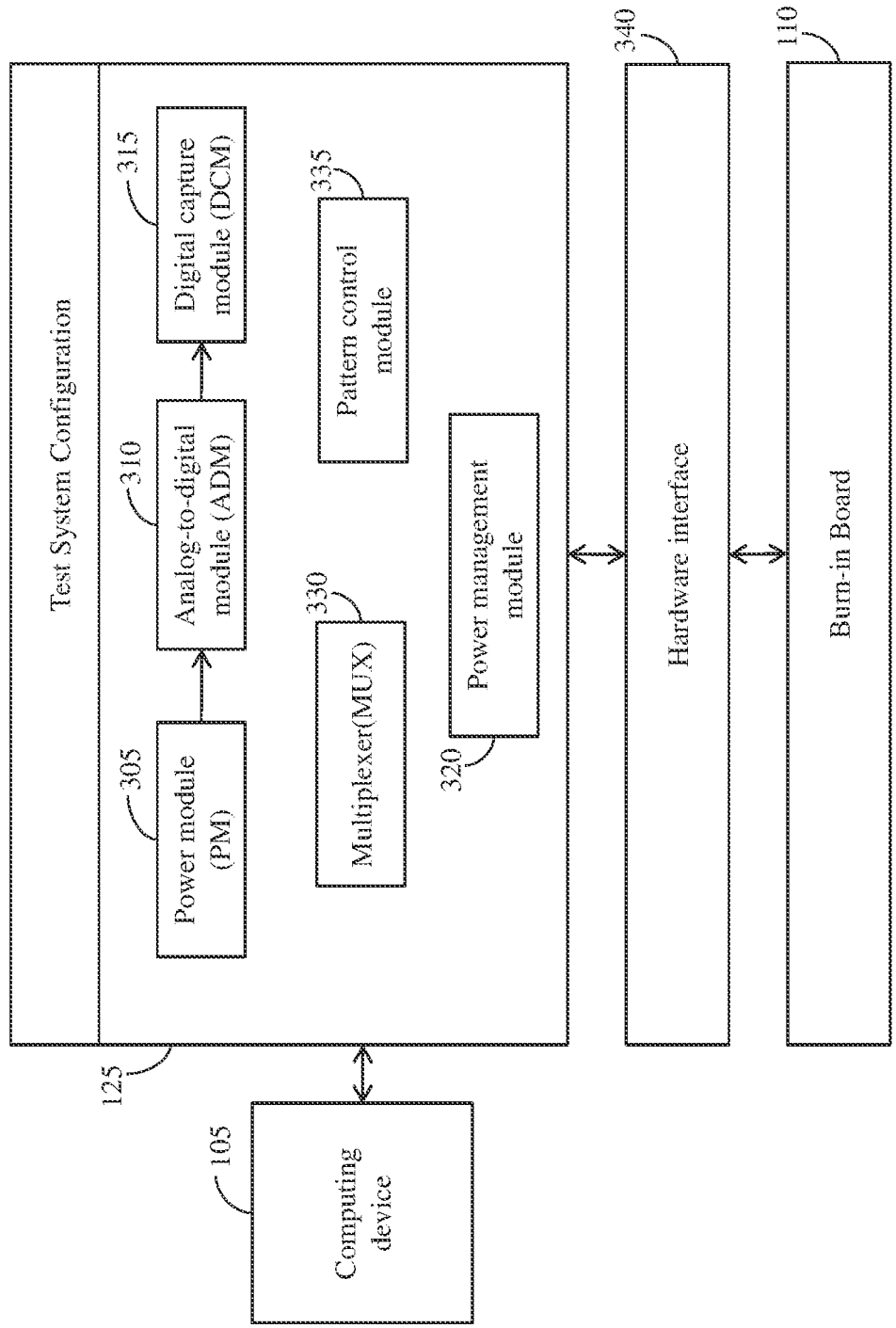
FIG. 3 is a schematic representation of a test system configuration in accordance with one embodiment.

FIG. 3 is a schematic representation of a test system configuration in accordance with one embodiment. FIG. 3 includes the test system configuration 125 that includes a power module (PM) 305, an analog-to-digital module (ADM) 310, a digital capture module (DCM) 315, a power management module 320, a multiplexer (MUX) 330, and a pattern control module 335; a hardware interface 340, the burn-in board 110, and the computing device 105.

The PM 305 is utilized to drive a DUT, for example the DUT 120a. Further, the PM 305 may be utilized for controlling analog power supplies. The test system configuration 125 may include one or more PMs. Each of the PMs drives multiple DUTs and includes corresponding hardware identifiers hereinafter referred to as HW_ID. Each of the PMs is allotted corresponding HW-IDs to allow sharing of a common communication channel. The common communication channel establishes a connection between the PMs and the computing device 105. Further, the PM may utilize RS232 standard mode of communication. RS232 standard mode of communication establishes communication between the PM 305 and each DUT 120. Multiple communication protocols may be utilized for performing data validation. Each of the PMs can further be connected to the burn-in board 110 using, among other devices, ribbon cables and a combo connector supporting signals and power. The PM 305 further controls the supply of constant current to each DUT 120 by the current input circuit 210. The PM 305 can also be configured to supply high power. The PM 305 may be configured to control an external power supply utilized for supplying the high power for testing the DUTs that require the high power for testing.

In an additional embodiment, the PM 305 can include an 8-bit pulse width modulator (PWM). The PWM may be utilized for generating power utilized for driving the DUTs. Further, it should be appreciated that the PWM may be upgraded with a plurality of versions of the PMs available. The PM 305 can be programmed by the user. Programming is performed to specify the voltage for driving the DUT as desired by the user. It should be appreciated that upgrading of the PWM to match multiple versions of the PMs does not affect programming performed by the user.

More than one PM 305 can be present. Each individual PM 305 can, for example, be programmed with a unique hardware identifier or HW ID. Such programming enables the user to control one or more of the PM 305 separately or together in concert, as desired. Thus, programming can enable driving multiple DUTs. The PM 305 can include an address range of up to 99, but if more modules are needed to meet a certain configuration, utilizing existing hubs like a multiport USB hub can further scale up the module beyond the address range since this is controlled through a hub. The software that controls or drives the PM 305 can include the following configurations or commands:

'ADDR DESC
  '0 NOT USED [RESERVED]
  '1 OSCCAL [PROGRAM CALIBRATED OSC VALUE]
  '2 OSCCAL BU [PROGRAM A BACK-UP CALIBRATED OSC VALUE]
  '3 OPTION—SEE BELOW [ENABLE OPTIONS]
  '4 HW ID [HW ID VALUE]
  '5 SCALAR-VALUE-HIGHBYTE MULTIPLIER [CALIBRATION FACTOR]
  '6 SCALAR-VALUE-LOWBYTE MULTIPLIER [CALIBRATION FACTOR]
  '7 a [VOLTAGE AT POWER UP]
  '8 PWM-VOUT.LOWBYTE [VOLTAGE AT POWER UP]
  '9-18 F/W INFO
  ;OPTION REGISTER
  ;1/0
  ;0 a2d [ENABLE ANALOG TO DIGITAL FUNCTION]
  ;1 -dump mem [DUMP CONFIGURATION FILE ON POWER UP]
  ;2 serin/no serin [DISABLE USER INTERFACE, USE DEFAULT CONFIGURATION ON POWER UP]
  ;3 vout=150/0[SET MAXIMUM AND MINIMUM VALUES]
  ;4 inc [ENABLE AUTO INCREMENT]
  ;5 -inc=10/inc=1 [SET INCREMENT VALUE]
  ;6 dec [ENABLE AUTO DECREMENT]

In the embodiment represented schematically in FIG. 3, the test system configuration 125 also includes one or more 12-bit ADM, for example, the ADM 310. The ADM 310 captures digital signals. The digital signals captured by the ADM 310 are in the range of +/−10 volts. The digital signals captured are supplied as input to drive multiple DUTs. Each of the ADMs include corresponding HW_IDs or hardware identifications. Each of the ADMs are allotted corresponding HW_IDs to allow sharing of the common communication channel. The common communication channel establishes a connection between the ADMs and the computing device 105. The ADM utilizes the RS232 standard mode of communication. Multiple communication protocols may be utilized for performing data validation.

Further, the ADM may be utilized to control analog-to-digital chip. The analog-to-digital chip is utilized to convert an analog power supply into a known digital voltage value. The known digital voltage value is captured using the ADM 310. Furthermore the ADM 310 may include multiple channels that can be programmed. Programming may be performed to drive the multiple DUTs associated to the ADM 310. Moreover, the ADM 310 includes an address range of up to 99.

In the embodiment represented schematically in FIG. 3, the test system configuration 125 also includes the DCM 315. The DCM 315 may be utilized for monitoring output pins of each DUT 120. The DCM 315 includes a monitor module utilized for monitoring one or more output pins of each DUT 120. The monitor module includes a display module capable of displaying the one or more output pins of each DUT 120. The DCM 315 may utilize an 8-bit shift register for monitoring the one or more output pins of each DUT 120. The DCM 315 cascades multiple 8-bit shift registers to monitor wide range of output pins of the DUT. In one example, the DCM 315 cascades two 8-bit shift registers to obtain 16-bit wide capture. Further, the DCM 315 may be utilized to capture output signals in real time histogram capabilities.

The DCM 315 can be regarded as a pattern control unit that functions independently of a processor controlling the DCM 315. The DCM 315 functions utilizing one or more interrupt routines that may be programmed as desired by the user. The interrupt routines may act on control signals, for example, a triggered signal or a strobed signal, while monitoring output pins of each DUT 120. With the DCM 315, a user can monitor the status of various output pins of each DUT 120. The DCM 315 includes multiple channels that may be programmed by the user. Programming is performed to establish communication between the DCM 315 and the computing device 105. Further, the DCM 315 includes an address range of up to 99 that may be programmed by the user.

In the embodiment represented schematically in FIG. 3, the test system configuration 125 also includes the multiplexer, MUX 330. The MUX 330 can be regarded as a general purpose printed circuit board (PCB) bearing multiple ports. The MUX 330 may be utilized for connecting a single test system configuration 125 to multiple ports of the computing device 105. Further, multiple ports included in the MUX 330 are utilized for connecting multiple DUTs. Connecting the single test system configuration 125 to multiple ports allows expansion of driver channels. Further, connecting the multiple ports included in MUX 330 to the multiple DUTs allows testing of multiple DUTs that can be present on multiple burn-in boards simultaneously. As a purely non-limiting example, one MUX 330 can connect 1, 2, 3, or 4 DUTs. The burn-in board 110 can include 14 dedicated digital input/output channels to drive the DUT. The burn-in board 110 also includes 24 analog test channels for monitoring the output pins of the DUT. Connecting the single test system configuration to multiple ports can be further increased by programming input/output pins of the MUX 330. The MUX 330 includes an input for accommodating multi-meters, for example, Agilent 34401A. The multi-meters such as Agilent 34401A included in the MUX 330 can be programmed and controlled using the software installed in the computing device 105. Additionally, the test system configuration 125 can comprise more than one MUX 330. As a non-limiting example, a test system configuration 125 can have 1, 2, 3, 4, 5, or 6 MUX 330. Thus, if one MUX 330 can connect 4 DUTs, then a test system configuration 125 with 6 MUX 330 would be able to test 24 devices at once. In an additional embodiment, a user can select which of the one or more MUX 330 to enable for a given test, for example, using software installed on the computing device 105.

The test system configuration 125 includes a hardware interface 340. The hardware interface 340 establishes communication among multiple testing modules, for example, the PM 305, the analog-to-digital module (ADM) 310, the digital capture module (DCM) 315, the power management module 320, the MUX 330, and the pattern control module 335 included in the test system configuration 125. Examples of hardware interfaces include, but are not limited to, a ribbon cable and an expandable backplane. The multiple testing modules that can be present in the test system configuration 125 can also be connected to the burn-in board 110 using high speed and high temperature ribbon cables. Using the ribbon cable allows the test system configuration 125 to test any burn-in board with proprietary connector interface using ovens or test chambers. Further, one or more functions may be embedded in the DCM 315 and the ADM 310 that allows the user to perform function call using the PC. The function call may be utilized to perform functions embedded in the DCM 315 and the ADM 310 as desired by the user.

The computing device 105 includes a user interface (UI). The UI may be regarded as software that can be installed in the computing device 105. Examples of the computing device 105 include, but are not limited to, a desktop personal computer, a laptop computer, a tablet, a mobile phone, or the like. The software may be utilized for controlling communication between multiple testing modules that can be present in the test system configuration 125 with multiple ports of the computing device 105. The software includes a user code that is programmed by the user. The user code may define pre-defined actions, for example, load pattern for loading test program, run pattern for executing test program, and loop pattern for iterating test program. The software further includes various library functions, for example, a burn-in test communication library and the backplane communication library. The library functions ensure necessary interface between multiple testing modules that can be present in the test system configuration 125 and the computing device 105. The UI further includes a test flow control module. The test flow control module controls one or more parameters required for establishing communication between multiple testing modules that can be present in the test system configuration 125 and the computing device 105.

The software installed in the computing device 105 may be programmed as desired by the user. Programming is performed to establish communication between the test system configuration 125 and the serial ports of the computing device 105. The UI also includes a graphical user interface (GUI). The GUI can be referred to as user-friendly software for controlling communication. The GUI can include one or more buttons to control various operations, for example, run the test, hold the test, or stop the test. Further, the computing device 105 can include a display unit for monitoring various conditions, for example, temperature of oven can be monitored in real-time using a display device. The UI also supports vector conversion from other automated test equipment (ATE) platform to the system format. The software can include a database for collecting data and storing results. The computing device 105 is further capable of being connected to an outside network or networks, such as the Internet.

Additionally, the test system configuration 125 can include the pattern control module 335. The pattern control module 335 generates electrical signals corresponding to logic state-1 and logic state-0. The electrical signals generated by the pattern control module 335 stimulate inputs of the DUT, for example, the DUT 120*a*. In one embodiment of the invention, software in the computing device 105 can generate the electrical signals based on user input. Thus, a user can program the pattern control module 335 to generate specific patterns for each DUT he or she wishes to test. The pattern control module 335 is therefore customizable by the user and can accommodate multiple signal patterns to test multiple DUTs attached to the burn-in board 110. The software is also capable of instructing the pattern control module 335 to generate multiple signal patterns in parallel. As a non-limiting example, the pattern control module 335 can include the following configurations or commands:

<$1> UPLOAD PAT TO MEMORY",CR]
<$2> MEASURE ADCIN",CR]
<$3> RUN VECTOR",CR]
<$4> SET BIB_ID",CR]
<$5> SET MUXBLK ID",CR]
<$6> TRIS_ON",CR]
<$7> RUN VECTOR W/O TRIS",CR]
<$8> SEND 16-BIT READBACK DATA",CR]

In a further embodiment of the invention, a pattern control module 335 comprises vectors capable of operating at a higher testing frequency but still compatible with vectors common to other, commonly available, burn-in board testers. As a non-limiting example, the pattern control module 335 can include the following configurations or commands:

<$00> WRITE ENABLE",CR] 'OK
<$01> WRITE DISABLE",CR] 'OK
<$02> READ STATUS REGISTER",CR] 'OK
<$03> WRITE STATUS REGISTER",CR]
<$04> READ DATA",CR] 'OK

<$05> FAST READ",CR]
<$06> FAST READ DUAL OUTPUT",CR]
<$07> FAST READ DUAL I/O",CR]
<$08> PAGE PROGRAM",CR] 'OK
<$09> SECTOR ERASE(4 KB)",CR] 'OK
<$0A> BLOCK ERASE(32 KB)",CR]
<$0B> BLOCK ERASE(64 KB)",CR]
<$0C> CHIP ERASE",CR]
<$0D> JEDEC ID",CR]
<$0E> UPLOAD 256 BYTES",CR]
<$0F> ENTER 24-BIT ADDRESS",CR]
<$10> READ 24-BIT ADDRESS",CR]
<$11> INCREMENT PAGE ADDR",CR]
<$12> DECREMENT PAGE ADDR",CR]
<$13> GOTO PAGE 0",CR]
<$14> TEST_WR_PAGE 0xAA55",CR]
<$15> TEST_RD_PAGE",CR]
<$16> START READ LOOP @ PAGE_0 WITH INT_CLK",CR]
<$17> START READ LOOP @ PAGE_0 WITH EXT_CLK",CR]
<$18> CHIP SELECT CONFIG",CR]
<$19> SET HW_ID",CR]

In yet another embodiment of the invention, a pattern control module 335 comprises a high-speed processor capable of being used as a programmable clock source. As a non-limiting example, the pattern control module 335 can include the following configurations or commands:

<$0>: LOOP PATTERN",10]
<$1>: UPLOAD PATTERN",10]
<$3>: RUN PATTERN",10]
<$5>: CONVERT PATTERN", 10]
<$6>: RUN TEST VECTOR", 10]
<$7>: DISCONNECT_HW",10]
<$9>: BURST PATTERN", 10]
<$B>: CALIBRATE CLOCK", 10]
<$C>: SET NEW HWID", 10]
<$D>: UPLOAD CONFIG FILE", 10]
<$E>: TECH SUPPORT", 10,10]
<$A>: DISPLAY MENU",10]

The test system configuration 125 can also include the power management module 320. The power management module 320 can be combined from other modules, such as a power module, for example, PM 305, and an analog-to-digital module, for example, ADM 310. In one embodiment, the power management module 320 is capable of testing and adjusting voltage and current. In a further embodiment, a user can set a specific voltage trigger value or values such that different events can occur if the voltage varies from the trigger value or values. These events can include one or more of the following: notifying the user that the voltage varies from the trigger value or values, shutting down the testing module comprising the voltage that has varied from the trigger value or values, continuing the test despite the voltage varying from the trigger value or values, ignoring the voltage varying from the trigger value or values, and changing the voltage trigger value or values and continuing the test. Information obtained by the power management module 320 can be relayed to the user by means of a GUI on the computing device 105. The test system configuration 125 may also include a scalable and programmable power regulator.

Based on the foregoing, it should be appreciated that the test system configuration is customizable for a given DUT. Each of the modules within the test system configuration can be configured using corresponding software instructions to provide the desired signal to one or more channels of the DUT to drive pre-selected tests. Moreover, not all of the modules need to be used for testing, and additional modules can be added to provide additional testing. Accordingly, modules can be stacked and integrated to provide more options. Modules can be combined on the same printed circuit board with other modules that can be treated as optional or used as an option or other optional modules can be on a separate printed circuit board. It should be appreciated that when the modules are stacked and on the same printed circuit board, they will utilize the same single interface to the computing device. It should also be appreciated that duplicate modules on separate printed circuity boards can be used and can be configured separately and differently that allows the system to be scaled up to accommodate a given DUT. Further, each of the modules can be configured to provide the desired signal for purposes of a desired test. Therefore, innumerable possibilities exist for configuring these modules. This provide the ability to design and customize tests specific to a given DUT, which can also be performed during testing with a burn-in board. As noted, such testing is typically conducted after the burn-in board testing. In other words, tests designed to evaluate the DUT functionality are typically not performed, nor would corresponding data from the DUT be collected. Therefore, the ability to perform tests and collect output data from the DUT during burn-in board testing improves efficiency compared to current burn-in board test procedures and testers.

Figure 4:
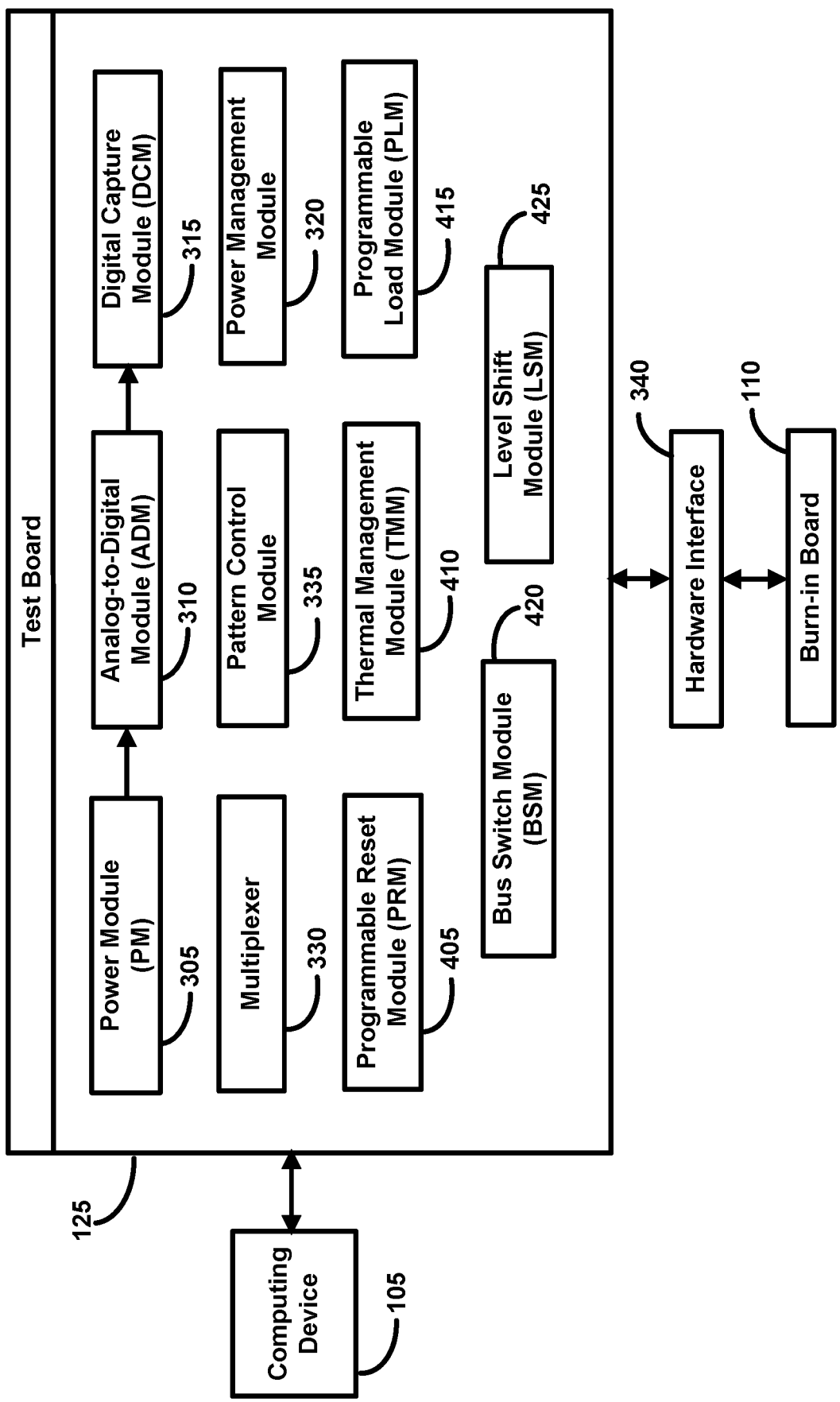
FIG. 4 is a schematic representation of a test system for providing testability for devices under test present in various types of burn-in boards and ovens, in accordance with one embodiment.

FIG. 4 is a schematic representation of a test system for providing testability for devices under test present in various types of burn-in boards and ovens, in accordance with another embodiment. As represented schematically in FIG. 4, the test system configuration 125 in this embodiment can comprise one or more additional tester modules, as required by the user. These modules include, but are not limited to, a programmable reset module (PRM) 405, a thermal management module (TMM) 410, a programmable load module (PLM) 415, a bus switch module (BSM) 420, and a level shift module (LSM) 425.

A programmable reset module (PRM) 405 can be configured from a PM, such as PM 305, and a relay switch, and is thereby capable of resetting or rebooting test modules as desired by the user. The PRM 405 may be activated by a signal sent from the computing device 105.

A thermal management module (TMM) 410 can likewise be configured from other modules. In one embodiment, a TMM 410 is configured from a PM, for example PM 305, and an ADM, for example, ADM 310. A TMM 410 would be capable of measuring and monitoring the temperature at the junction between a given DUT and its corresponding socket on the burn-in board 110. Based on this information, which can be displayed on a GUI on the computing device 105, a user can maintain, raise, or decrease the temperature at a given electrical junction according to the user's testing needs. As another non-limiting example, the TMM 410 could also be used to cool or heat the temperature at the junction as necessary or as desired by the user in order to maintain a stable temperature. Thus, a user could program the TM 410 with a specific temperature trigger value, and if the temperature at the junction reaches or exceeds the trigger value, different events could occur, depending on the user's preferences. These events could include one or more of the following: notifying the user that the temperature trigger value has been met or exceeded, shutting down the testing module comprising the electrical junction where the temperature trigger value has been met or exceeded, continuing the test despite the temperature trigger value being met or exceeded, ignoring the temperature trigger value being met or exceeded, and changing the temperature trigger value and continuing the test.

A programmable load module (PLM) 415 is capable of disabling or enabling individual pins on individual sockets on the burn-in board 110. In one embodiment of the invention, a user can ensure proper setup for a test by using the PLM 415 before applying power, thereby determining whether an individual socket is properly transferring power to any DUT connected to that socket. Again, a user can program the PLM 415 using software installed on the computing device 105. As a non-limiting example, a user can utilize the software installed on the computing device 105 to disable or enable one or more pins on one or more sockets on the burn-in board 110.

A bus switch module (BSM) 420 is capable of selecting individual sockets on the burn-in board 110 to test. In one embodiment of the invention, the BSM 420 is connected to a MUX 330. A user can utilize the BSM 420 to select a given socket, with its corresponding connected DUT, to test. The user can make such a selection through the software installed on the computing device 105.

A level shift module (LSM) 425 is capable of adjusting voltage and/or current levels according to the user's specifications. In one embodiment of the invention, a user can instruct the LSM 425 to adjust voltage and/or current through a GUI on the computing device 105.

It should be appreciated that different combinations of the testing modules previously described can be added to a test system configuration 125, depending on the user's preferences. The test system configuration 125 is therefore customizable and different combinations of testing modules present on the test system configuration 125 can enable verification of one or more different DUTs, as desired by the user. Furthermore, the test system configuration 125 can be a stand-alone system that can be connected or disconnected from the burn-in board 110, depending on the user's preferences. Alternatively, the test system configuration 125 can be synchronized with any software on the computing device 105 connected to the burn-in board, thereby working in parallel with the computing device 105 to test one or more DUTs.

A further embodiment of the invention includes a tester interface board (TIB), which comprises a custom configuration port for testing purposes. The TIB is capable of testing either one or multiple DUTs. If desired, a user can input common input signals to the TIB, which then utilizes the common input signals to test multiple DUTs. The TIB is also capable of reading output from a single DUT. In a further embodiment, the TIB is also configured to measure and monitor the power supplied to each DUT being tested. In yet another embodiment, a computing device, such as the computing device 105, controls the TIB. The computing device may have programmable software that controls the DUTs connected to the TIB, thereby enabling the user to program and customize different testing parameters for different DUTs.

It should be appreciated that the computing device 105 can comprise software that can control any or all of the various testing modules on the test system configuration 125. One embodiment of the invention comprises a computing device 105 that includes software capable of programming all of the testing modules in the test system configuration 125 according to the user's testing specifications. In this embodiment, a user could select the testing module or modules he or she wishes to program for a given test and then configure only that module or modules. It should be appreciated that this embodiment of the invention enables users to test multiple DUTs in relatively quick succession by simply changing the configurations of testing modules as necessary. In another embodiment of the invention, a test system configuration 125 is connected to more than one burn-in board 110 and the test system configuration 125 is capable of testing all of the DUTs connected to the burn-in boards at the same time. In this embodiment, a user can program any or all of the testing modules to execute different tests in parallel, for example, a different test for each burn-in board 110 connected to the test system configuration 125. Alternatively, a user could program the software in the computing device 105 to run the same test in parallel across multiple burn-in boards, thereby rapidly testing duplicates of the same DUT or DUTs. In such an embodiment of the invention, the software installed on computing device 105 enables the user to run tests in a scalable fashion. Additionally, any software associated with the computing device 105 can integrate any additional external testing apparatuses that may be connected to the burn-in board 110.

Figure 5:
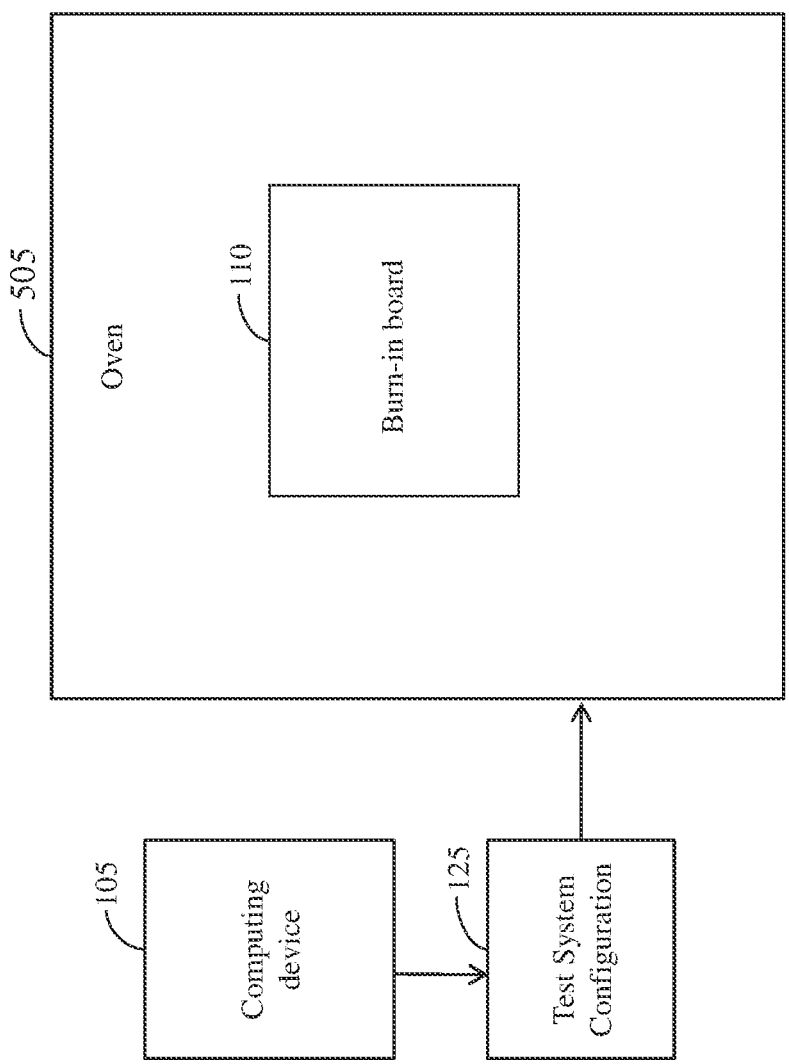
FIG. 5 is a schematic representation of a system for providing testability for DUTs present in various types of burn-in boards and ovens, in accordance with one embodiment.

FIG. 5 is a schematic representation of a system for providing testability for DUTs present in various types of burn-in boards and ovens, in accordance with one embodiment. FIG. 5 includes an oven 505, a burn-in board, for example, the burn-in board 110, the computing device 105, and the test system configuration 125.

The burn-in board 110 can include multiple DUTs. Each of the DUTs are placed in corresponding sockets included in the burn-in board 110. The burn-in board 110 can be placed in various types of ovens, for example, the oven 505. The burn-in board 110 allows testing of the multiple DUTs placed in the various types of ovens. Moreover, the corresponding sockets can be customized to allow electrical connection to each of the channels in a given DUT. This permits testing of DUTs with any given number of channels in one pass or in one test and avoids the use of a tester having a set number of channels and related modules and software that results in having to perform multiple passes of testing. For example, if a tester has a fixed number of channels and a DUT has more channels than that fixed number, the DUT will have to be tested multiple times using multiple burn-in boards to, in total, provide for testing of all channels of the DUT.

The computing device 105 can be regarded as a system controller. Software may be installed in the computing device 105 for establishing communication between the user and the burn-in board 110. Further, the computing device 105 includes a storage device for storing results of the test performed using the burn-in board 110.

The test system configuration 125 includes multiple testing modules for controlling testing of DUT. Examples of the modules include, but are not limited to, the PM 305 for controlling power supply to the DUT, the ADM 310 for capturing voltage signals in digital form that allow testing of DUT within the captured voltage range, the DCM 315 for monitoring output of the DUTs, and the MUX 330 for providing expansion for testing the DUTs. Each of the multiple testing modules included in the test system configuration 125 may be configured independently. Configuration may be performed by programming each of the testing modules using the software installed in the computing device 105. Programming enables a user to perform testing of the DUT under specified conditions. Examples of the specified conditions include, but are not limited to, setting a constant temperature, setting a constant power supply to be supplied to the DUT, setting number of hours the DUT is required to be tested, setting constant pressure, setting constant humidity and the like.

The user may utilize a software code for specifying various conditions, in one example temperature of the oven. The software code further controls communication between the burn-in board 110 and the computing device 105. The software installed in the computing device 105 provides necessary interface for establishing communication between the burn-in board 110 and the computing device 105. The computing device 105 further includes a display device for monitoring various conditions. In one example, temperature of the oven may be monitored in real time using the display device.

The test system configuration 125 is scalable. In one example, if the user requires additional power supplies for testing then the test system configuration 125 can be configured for the additional power supplies using external PMs. Further, as already described above, the test system configuration 125 can comprise multiple testing modules as desired by the user. Thus, any given test system configuration 125 is customizable to be used in connection with any type of burn-in board without the necessity for building multiple test boards to test multiple DUTs individually. The user can further customize the test system configuration 125 to test the DUTs at various conditions as desired by the user, for example, using software installed on the computing device 105.

Figure 6:
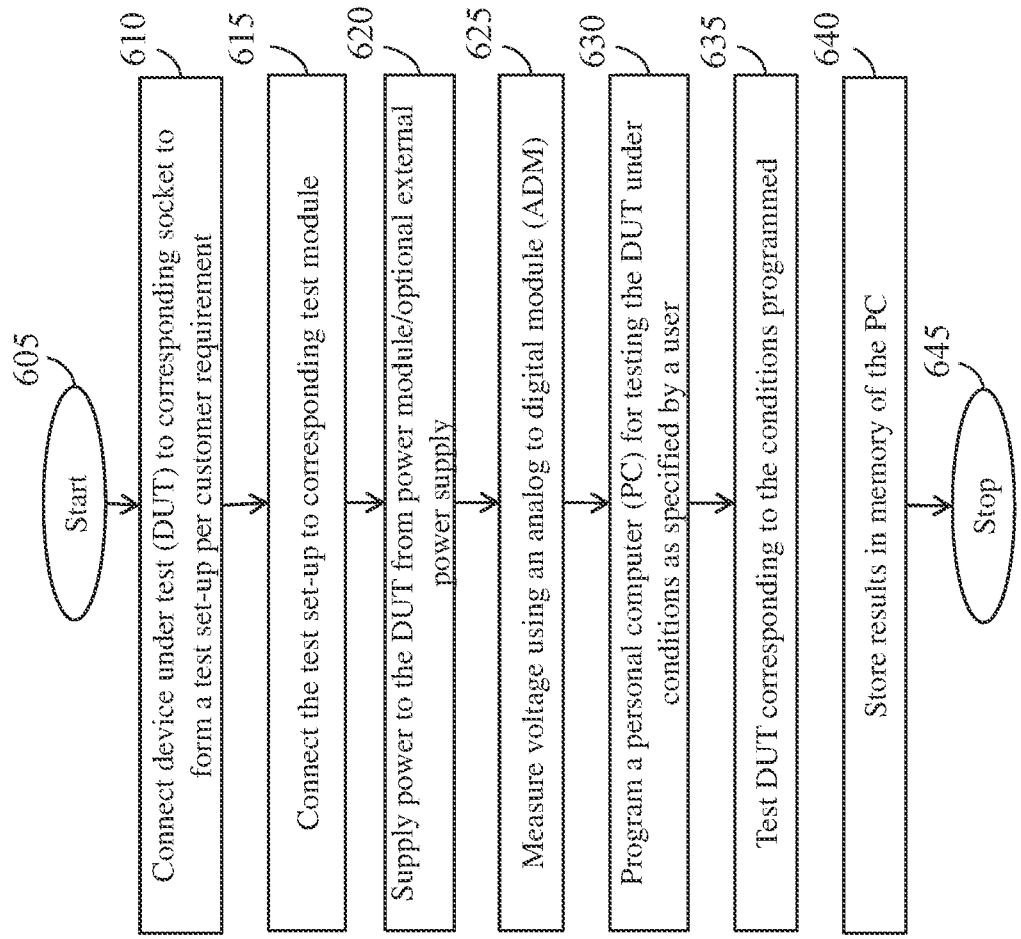
FIG. 6 is a flowchart illustrating a method for testing a device under test, in accordance with one embodiment.
Figure 7B:
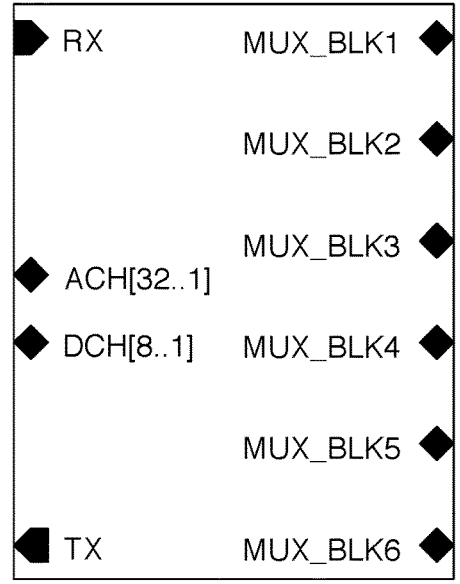
Figure 7B:
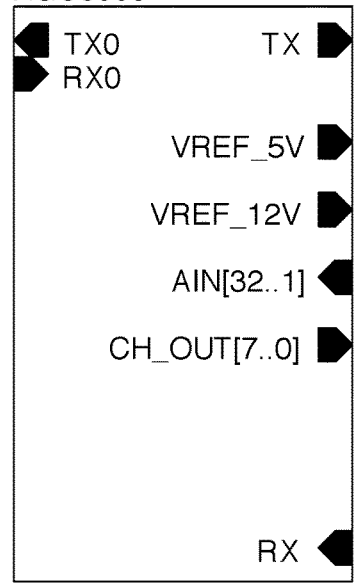
Figure 7B:
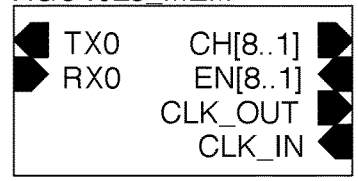
Figure 7B:
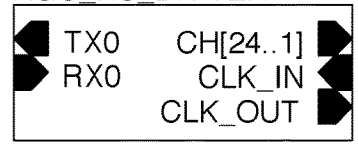
Figure 7C:
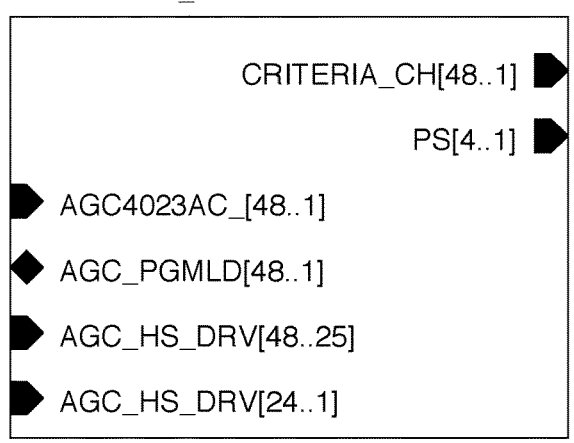
Figure 7C:
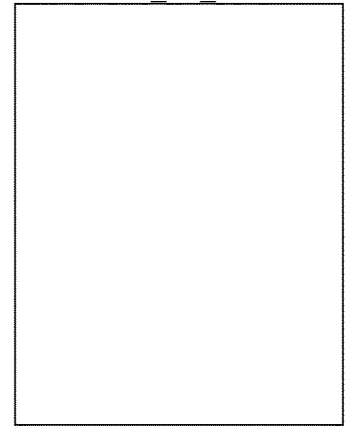
Figure 7C:
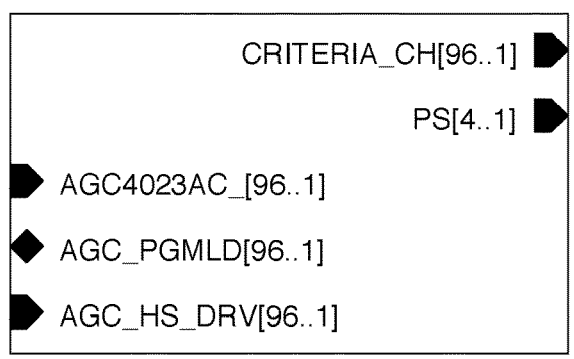
Figure 7C:
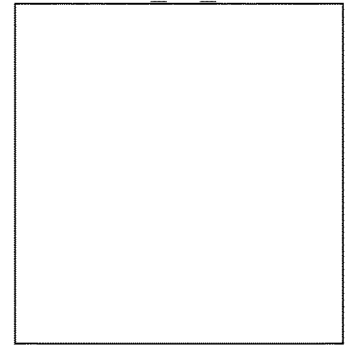
Figure 7C:
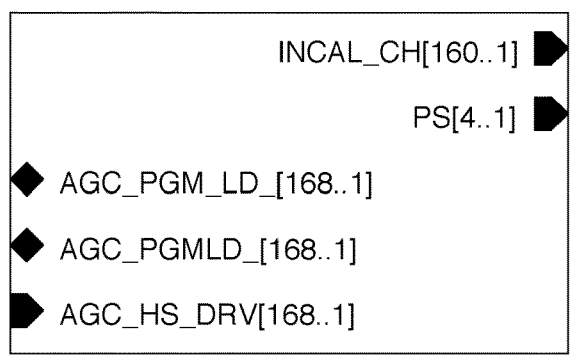
Figure 7C:
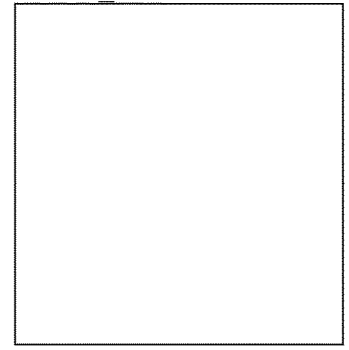
Figure 7C:
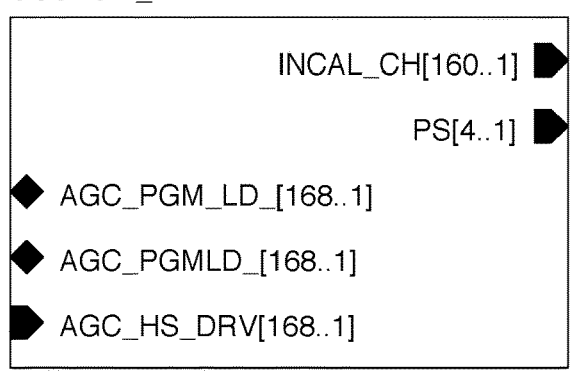
Figure 7C:
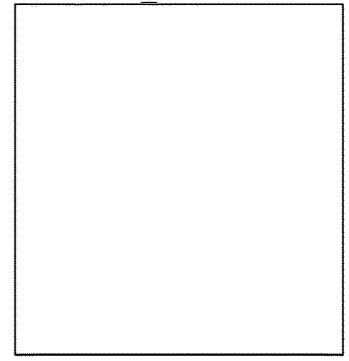

FIG. 6 is a flowchart illustrating a method for testing a device under test (DUT) in accordance with one embodiment. The method starts at step 605. At step 610, the DUT is connected to a corresponding socket on a burn-in board. The DUT connected to corresponding socket constitutes a test set-up per customer requirement. Each burn-in board includes multiple sockets. A single burn-in board can be used to test multiple DUTs.

At step 615, the test set-up is connected to a test system configuration, including the desired test modules for testing the DUT. The test system configuration can include a power module (PM), an analog-to-digital module (ADM), a digital capture module (DCM), a power management module, a multiplexer (MUX), a pattern control module and a hardware interface. The test system configuration can further include any or all of the testing modules described above in connection with FIG. 3 and FIG. 4. It should be appreciated that a custom hardware interface may be used to provide the connection between the test set-up, including the burn-in board and the DUTs, with the modules of the test system configuration.

One of the testing modules used may be a PM, which supplies power to the DUT. The power supply is utilized for driving the DUT. The PM can function independently of other testing modules included in the test board. The PM can also be configured to communicate with a computing device, for example, a desktop personal computer, a laptop computer, a tablet, a mobile phone, or the like. The communication between the computing device and the PM is established using software that is installed in the computing device. The software may be programmed as desired by a user.

A further testing module that can be used in this embodiment of the invention is an ADM, which measures voltage. The ADM captures digital signals in the range of +/−10 volts. The digital signals captured are supplied as input to drive multiple DUTs. The ADM can function independently of other testing modules included in the test board. The ADM can also be configured to communicate with the computing device, for example a desktop personal computer, a laptop computer, a tablet, a mobile phone, or the like. The communication between the computing device and the ADM is established using software installed in the computing device. The software may be programmed to capture voltage values as desired by the user.

Another testing module that can be used in this embodiment of the invention is a DCM, which monitors output pins of the DUT. The DCM includes a monitor module utilized for monitoring one or more output pins of the DUT. The DCM may be regarded as a pattern control unit that can function independently of a processor controlling the DCM. The DCM can function utilizing one or more interrupt routines that may be programmed as desired by the user. The DCM may be configured to communicate with a computing device. The communication between the computing device and the DCM is established using software installed in the computing device.

A further testing module that can be used in this embodiment of the invention is a MUX, which connects a single test board to multiple ports of a computing device. The MUX includes an input for accommodating external devices, for example, multi-meters. The MUX is configured to communicate with the computing device. The communication between the computing device and the MUX can be established using software installed in the computing device.

Connection between the various testing modules of the test system configuration and a computing device is established via the hardware interface. Thus, the hardware interface enables communication between multiple testing modules and the computing device. Further, the hardware interface connects, and establishes communication among, the testing modules included in the test system configuration.

At step 620, power is supplied to the DUT using the PM. Multiple PMs may be utilized for supplying power to multiple DUTs. The user can configure one or more PMs to supply a constant power to drive one or more DUTs. The user can enable one or more configurations by programming the one or more PMs, for example, using software installed on a computing device that is connected to the burn-in board. The power can also be supplied to the DUT using an optional external power supply. For higher power requirements, the one or more PMs can control analog power supplies that can be used to supply positive or negative supplies to the DUTs. The one or more PMs control power-up and power-down sequences to the DUTs. Further, the one or more PMs control high voltage level control for driving signal to the DUTs. The one or more PMs can also include sense lines to regulate voltages in the burn-in board.

At step 625, a voltage is measured using the ADM. A user may specify a specific voltage to be measured, and can do so by configuring the ADM. The user can configure the ADM by programming the ADM, for example, using software installed on a computing device that is connected to the burn-in board. Upon specifying the voltage, the DUT is tested under specified voltage conditions.

At step 630, a user programs a computing device that is connected to the burn-in board in order to test the DUT under conditions as specified by the user. Examples of specified conditions include, but are not limited to, setting a constant temperature, setting a constant power supply to be supplied to the DUT, setting number of hours the DUT is required to be tested, setting constant pressure, setting constant humidity and the like. Further, the computing device may be programmed to store results of the DUTs of corresponding smart sockets in respective memory locations.

After a user programs the computing device with the user's required test conditions, the DUT is then tested under those specified conditions in step 635. Testing includes checking for electrical connectivity between the DUT and the corresponding smart socket. If the user wishes, he or she can test each pin of the DUT individually by configuring multiple testing modules present in the test system configuration. Again, the user can enable different configurations using software installed on the computing device. For example, a user can test each pin of the DUT for electrical continuity. Testing further includes subjecting the DUTs to various voltage ranges. The testing also includes functional test read back and executing multiple test configurations, as specified by the user. Testing the DUTs under various voltage ranges and by using multiple test configurations ensures high test fault coverage.

At step 640, test results are stored in a memory associated with the computing device. The computing device communicates with the multiple testing modules included in the test system configuration using communication protocols. In one example, RS232 standard mode may used for establishing communication between the test system configuration and the computing device. The test system configuration may be programmed to store the results of DUT of corresponding smart sockets at specified memory locations. Storing results at the specified memory locations enables a user to separately store test results of multiple DUTs that are associated to multiple burn-in boards. After test results are stored, the method concludes at step 645.

The system used in the embodiment of the invention depicted schematically in FIG. 6 can further include multiple hardware units, for example driver channels, power supplies, DC measurement and device test points for performing testing of the DUTs. The system can also allow reliable connection of various hardware units and testing modules using high speed ribbon cables. The system provides scalability to the user by allowing him or her to test multiple DUTs using one test board. A user can simply configure the testing modules on the test board, for example, through software installed on a computing device, in order to test multiple DUTs. This obviates the need for a user to repeatedly change test boards to test different DUTs.

FIG. 7A-7D illustrates a schematic according to one embodiment of the invention. FIG. 7A-7D illustrates some of the various modules that can be used in the test system configuration. All of the modules are programmable using a computing device, such as a personal computer and have their own hardware ID. Each module can be programmed in serial or parallel mode. Each module is a separate building block that can be configured to provide a customized test system configuration for testing a given DUT.

Those skilled in the art will recognize that a wide variety of modifications, alterations, and combinations can be made with respect to the above described embodiments without departing from the scope of the present disclosure, and that such modifications, alterations, and combinations are to be viewed as being within the ambit of the inventive concept. For example, while the above has been described in some embodiments in connection with the test board being a burn-in board, it should be appreciated that the system and method described above can be used with any test board.

What is claimed is:

1. A system for testing at least one electronic device, comprising:
    a test board having at least one socket for receiving a corresponding at least one electronic device to be tested;
    a hardware interface electrically connected to said at least one socket of said test board;
    a test system configuration comprising at least one module for testing the corresponding at least one electronic device, electrically connected to said hardware interface, wherein said at least one module comprises:
        a first module configured to control an analog power to said test board;
        a second module configured to capture at least one digital signal, said at least one digital signal being supplied as an input to said at least one electronic device;
        a third module configured to monitor at least one output pin of said at least one electronic device;
        a fourth module configured to generate a plurality of electrical signals corresponding to either logic state-1 or logic state-0, said plurality of electrical signals stimulating said input of said at least one electronic device; and
        a multiplexer; and
    a computing device electrically connected to said test system configuration, said computing device comprising at least one set of programmable instructions to execute at least one test on said at least one electronic device,
    wherein said testing is performed either in a parallel testing mode or in a serial testing mode.

2. The system of claim 1, further comprising a fifth module capable of resetting analog power and triggering one or more responses when voltage varies from one or more pre-determined voltage values set by a user.

3. The system of claim 2, further comprising a sixth module configured to monitor temperature across at least one electrical junction.

4. The system of claim 3, further comprising a seventh module configured to disable and enable said at least one output pin when instructed by said at least one programmable set of instructions.

5. The system of claim 4, further comprising an eighth module configured to select at least one socket to test when instructed by said at least one programmable set of instructions.

6. The system of claim 5, further comprising a ninth module capable of adjusting voltage or current levels.

7. The system of claim 1, wherein said test system configuration further comprises at least one module selected from the group consisting of: a module configured to reset analog power, a module configured to monitor temperature across at least one electrical junction, a module configured to disable and enable said at least one output pin, a module configured to select said at least one socket to test, and a module configured to adjust voltage or current levels.

8. The system of claim 1, wherein said third module further comprises a display for displaying said at least one output pin.

9. The system of claim 8, wherein said third module further comprises at least one 8-bit shift register for monitoring said at least one output pin.

10. The system of claim 9, wherein said at least one 8-bit shift register comprises two 8-bit shift registers, and wherein said two 8-bit shift registers are combined to perform said monitoring said at least one output pin, to capture 16 bits of serial data.

11. The system of claim 9, wherein said at least one 8-bit shift register comprises a plurality of 8-bit shift registers, and wherein said plurality of 8-bit shift registers are combined to perform said monitoring said at least one output pin, to capture at least 16 bits of serial data.

12. The system of claim 9, wherein said at least one 8-bit shift register captures, in real time, at least one signal of said at least one output pin.

* * * * *